United States Patent [19]
Seok et al.

[11] Patent Number: 5,327,389
[45] Date of Patent: Jul. 5, 1994

[54] SEMICONDUCTOR MEMORY DEVICE HAVING A BLOCK SELECTION FUNCTION WITH LOW POWER CONSUMPTIONS

[75] Inventors: Yong-Sik Seok, Daegu; Dong-Sun Min; Dong-Soo Jun, both of Seoul; Jae-Gu Roh, Kyungki, all of Rep. of Korea

[73] Assignee: SamSung Electronics Co., Ltd., Suwon, Rep. of Korea

[21] Appl. No.: 918,770

[22] Filed: Jul. 27, 1992

[30] Foreign Application Priority Data

Aug. 14, 1991 [KR] Rep. of Korea ............... 1991-14100

[51] Int. Cl.[5] .............................................. G11C 7/00
[52] U.S. Cl. ............................. 365/230.03; 365/203; 365/230.02; 365/230.06; 365/231
[58] Field of Search ............... 365/230.03, 231, 230.02, 365/230.06, 203

[56] References Cited

U.S. PATENT DOCUMENTS

| | | | |
|---|---|---|---|
| 4,528,646 | 7/1985 | Ochii et al. | 365/203 |
| 4,569,036 | 2/1986 | Fujii et al. | 365/174 |
| 4,934,826 | 6/1990 | Miyatake et al. | 365/230.01 |
| 5,040,152 | 8/1991 | Yoss et al. | 365/63 |
| 5,043,947 | 8/1991 | Oshima et al. | 365/230.03 |

Primary Examiner—Eugene R. LaRoche
Assistant Examiner—F. Niranjan
Attorney, Agent, or Firm—Robert E. Bushnell

[57] ABSTRACT

A semiconductor memory device divided into a number of main blocks each main block having a number of subblocks selects a single main block and enables the subblocks of the selected main block, so as to reduce the power consumptions. The semiconductor memory device includes a block selector for selecting one of the main blocks in response to row address signals, a number of first boost circuits for selecting the subblocks of the selected main block in response to the row address signals, and a number of second boost circuits adapted to be disabled in response to the row address signals.

10 Claims, 9 Drawing Sheets

SEMICONDUCTOR MEMORY DEVICE HAVING A BLOCK SELECTION FUNCTION WITH LOW POWER CONSUMPTIONS

BACKGROUND OF THE INVENTION

The present invention relates to a semiconductor memory device having a memory cell array block selection function and more particularly to a device for selecting memory cell array blocks with low power consumptions.

Dynamic RAM (DRAM) can be widely divided into a memory cell array portion and a peripheral circuit portion. In such a DRAM, the power consumption ratio of the memory cell array portion to the peripheral circuit portion is normally 100 to 30. The power consumed in the memory cell array is generally caused by a write operation of writing data into a memory cell, which has been read out from a different memory cell and is determined by the refresh cycles and the number of divided memory cell array blocks. When the power is consumed abruptly, the power noises may be generated. Therefore, it is very important to reduce the power consumption in a semiconductor memory device with high speed and high density.

Figure 1A:
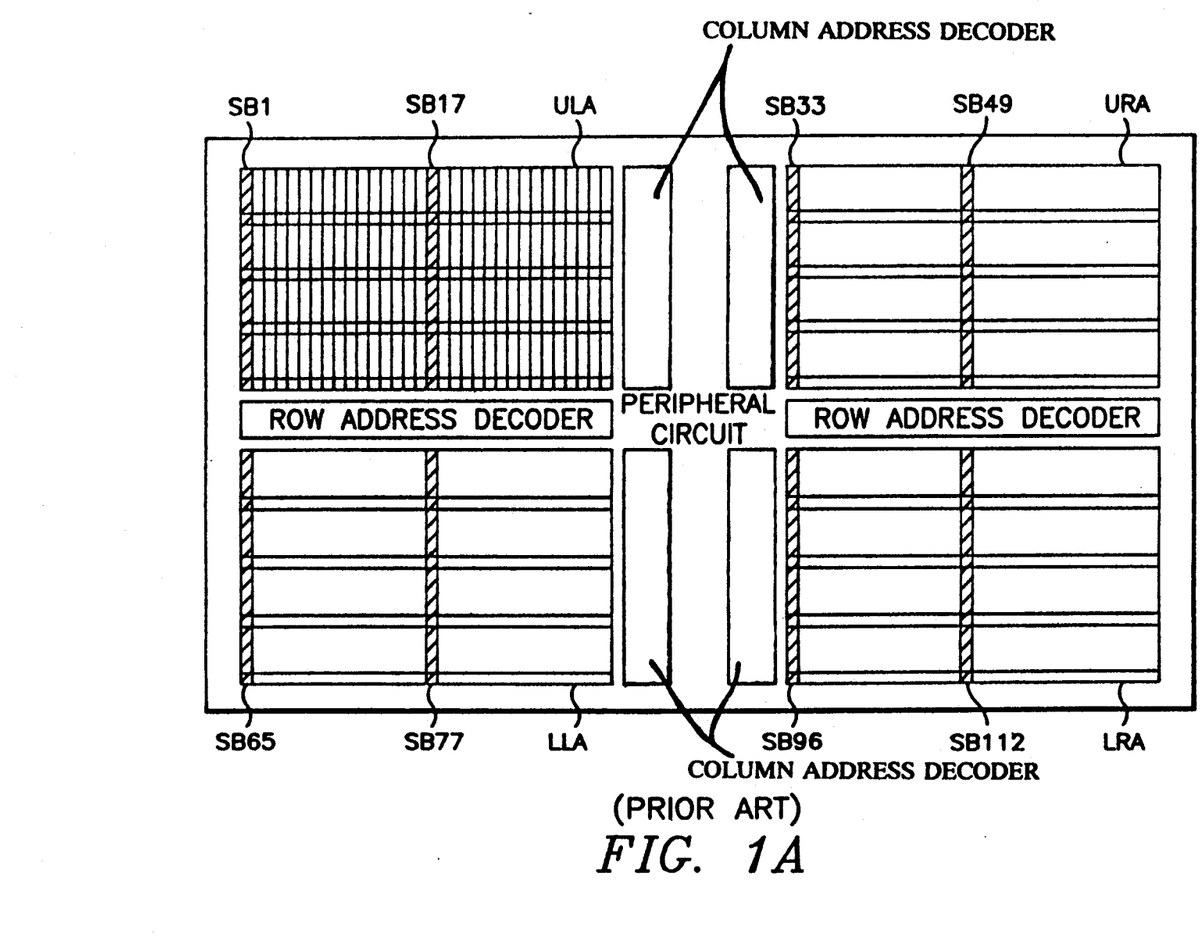
FIG. 1A shows a schematic diagram for showing subblock selection according to a conventional memory device.

Referring to FIG. 1A, the configuration of a known semiconductor memory chip with a block selection function is shown, wherein four main blocks ULA, URA, LLA, LRA are respectively divided into thirty-two subblocks. As shown in FIG. 1A, the conventional semiconductor memory device drives only a specific number of subblocks within each main block to distribute the entire power consumptions. For example, the subblocks SB1 and SB17 are selected in the upper left block ULA; the subblocks SB33 and SB 49 in the upper right block URA; the subblocks SB65 and SB77 in the lower left block LLA; and the subblocks SB96 and SB112 in the lower right block LRA.

Figure 1B:
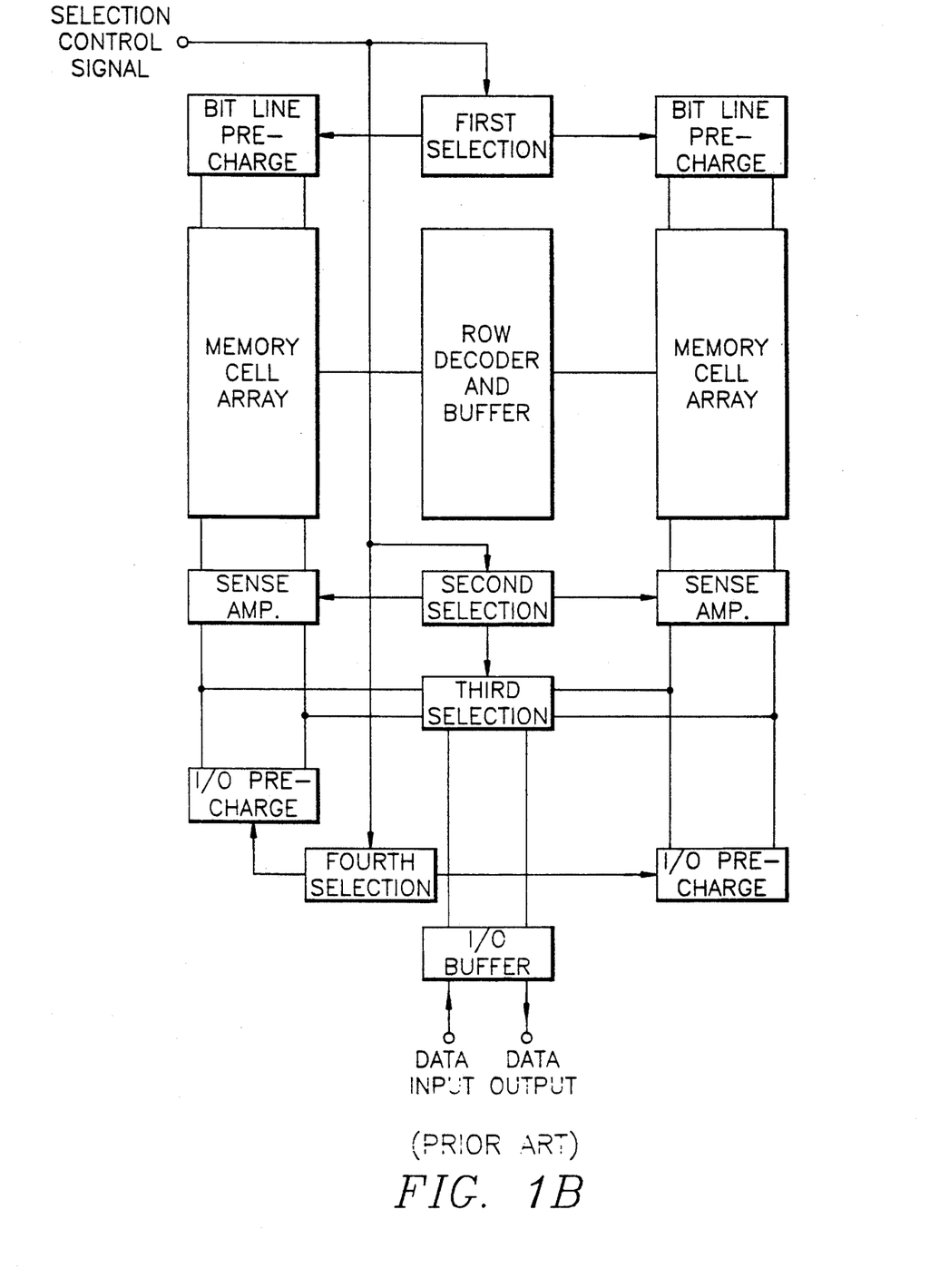
FIG. 1B shows an embodiment of the conventional memory device which selects the subblocks as shown in FIG. 1A.

Conventional semiconductor memory devices employing the partial activation technique as shown in FIG. 1A are disclosed in U.S Pat. Nos. 4,528,646 and 4,569,036. Referring to FIG. 1B, another conventional semiconductor memory device disclosed in U.S. Pat. No. 4,528,646 is shown. It is well shown in the drawing that the device is partially activated by first through fourth selection circuits which are controlled by a selection control signal. The first selection circuit controls selectively the left or right bit line precharge circuit to activate a bit line pair corresponding to a selected subblock of the left or right memory cell array. The second selection circuit activates a sense amplifier corresponding to a memory cell of the selected subblock. The third selection circuit activates a data bus line corresponding to the selected subblock, and the fourth selection circuit activates an input/output precharge circuit corresponding to the selected subblock. Namely, by driving the bit line precharge circuit, the sense amplifier, the data bus line, and the input/output precharge circuit which correspond to the subblocks SB1, SB17, SB33, SB49, SB65, SB77, SB96 and SB112, the memory cell array (which correspond to the subblocks of the respect main blocks of FIG. 1) is partially activated.

Figure 1C:
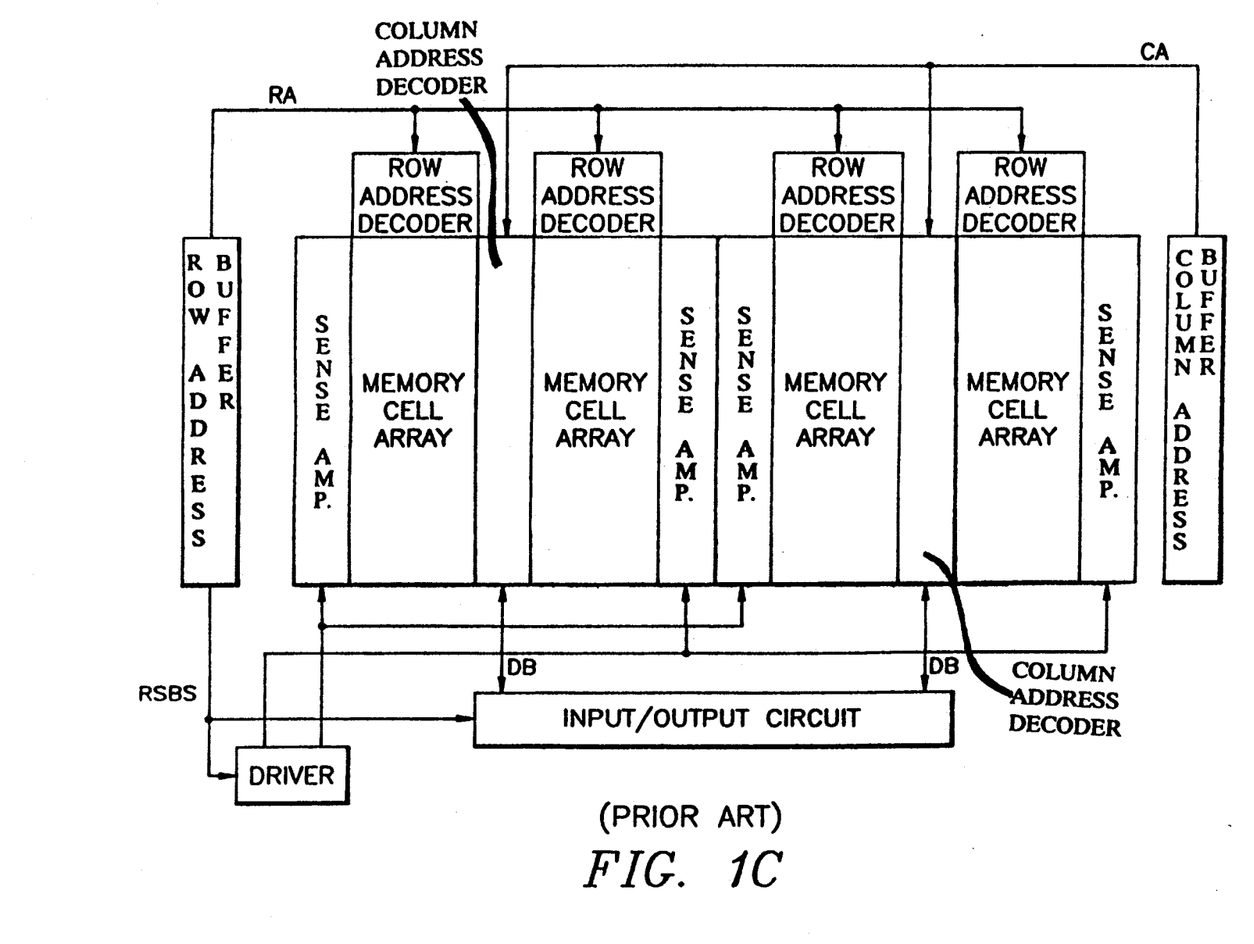
FIG. 1C shows another embodiment of the conventional memory device which selects the subblocks as shown in FIG. 1A.

Referring now to FIG. 1C, a conventional semiconductor memory device disclosed in U.S. Pat. No. 4,569,036 is shown. The device is a little different from the device shown in FIG. 1B, but a signal RSBS (randomly selected bit signal) generated from a row address buffer is applied to a driver circuit and sense amplifiers corresponding to the respective memory cell array are controlled by the driver circuit. It is noted that the device of FIG. 1C also has a partial activation function similarly to the device of FIG. 1A.

The memory device having the partial activation function has an advantage of reducing the noises by distributing the total power consumption of the memory cell array. However, in recent a dual pad and a double metal line are used for the power supply voltage terminal Vcc and/or the ground voltage terminal Vss because of the high density of the memory device, so that the noises are not considerably reduced in comparison with the device in which the power consumptions of the subblocks are not distributed. Instead, because in the case where the subblocks are evenly distributed the peripheral circuit for controlling the subblocks are additionally required, the entire peripheral circuits must be enabled even if only some of the subblocks in each main block are activated as shown in FIG. 1. This will increase not only the power consumption but also the peak current of the peripheral circuits. Such undesirable effect gets worse as the chip size increases, because the load of the wires of a control circuit for driving the subblocks is usually influenced by the capacitance formed between the metal and the substrate. Namely, as the chip size of the memory device increases, the transmission distance of the signals of the control circuit becomes longer and the areas of the metal and the substrate also increase. The foregoing relation can be understood from an equation of $C=A/d$, where A is the area of the metal and the substrate, and d is the space between the wires. Further, it can be appreciated from the related equations of $i=C(dv/dt)$ and $p=iv$ that the power consumption increases.

SUMMARY OF THE INVENTION

It is accordingly an object of the present invention to provide a semiconductor memory device with a plurality of subblocks capable of reducing the power consumptions of the peripheral circuits while the subblocks are selected.

According to an aspect of the present invention, a semiconductor memory device divided into a number of main blocks each main block having a number of subblocks selects a single main block and enables the subblocks of the selected main block, so as to reduce the power consumptions. The semiconductor memory device divided into first through fourth main blocks, each main block having a plurality of subblocks includes block selection means for selecting one of said first through fourth main blocks upon receipt of first and second row address signals, first boost circuit means for selecting the subblocks of said first main block upon receipt of the respective complementary address signals of said first and second row address signals, second boost circuit means for selecting the subblocks of said second main block upon receipt of the complementary address signal of said first row address signal, and said second row address signal, third boost circuit means for selecting the subblocks of said third main block upon receipt of said first row address signal and the complementary address signal of said second row address signal, fourth boost circuit means for selecting the subblocks of said fourth main block upon receipt of said first and second row address signals, first row address predecoder means for selecting word lines of the subblocks of said first and third main blocks upon receipt of the complementary address signal of said second row address signal, and second row address predecoder means for selecting word lines of the subblocks of said second and fourth main blocks upon receipt of said second row address signal.

BRIEF DESCRIPTION OF THE ACCOMPANYING DRAWINGS

For a better understanding of the invent and to show how the same may be carried into effect, reference will now be made, by way of example, to the accompanying diagrammatic drawings, in which.

DETAILED DESCRIPTION OF THE PREFERRED EMBODIMENTS

Figure 2:
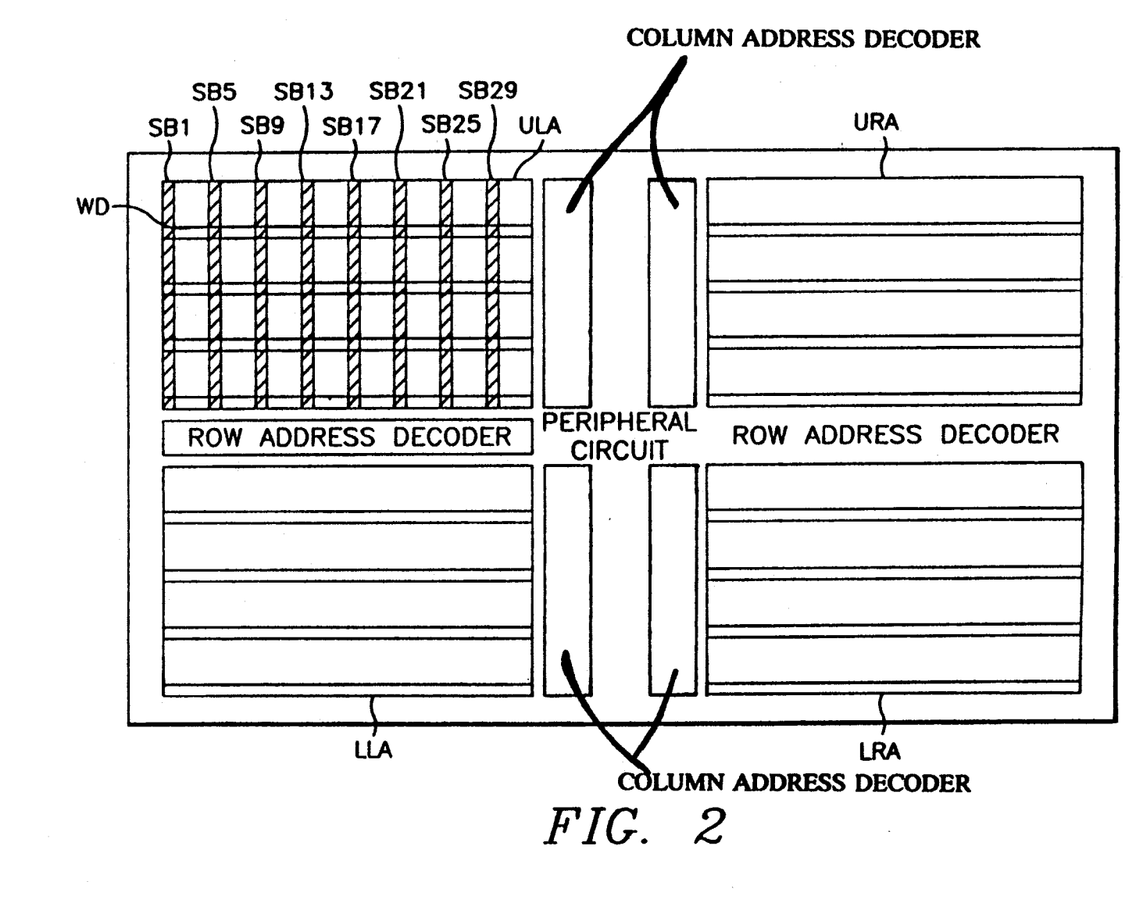
FIG. 2 shows a schematic diagram for showing subblock selection according to the present invention.
Figure 3A:
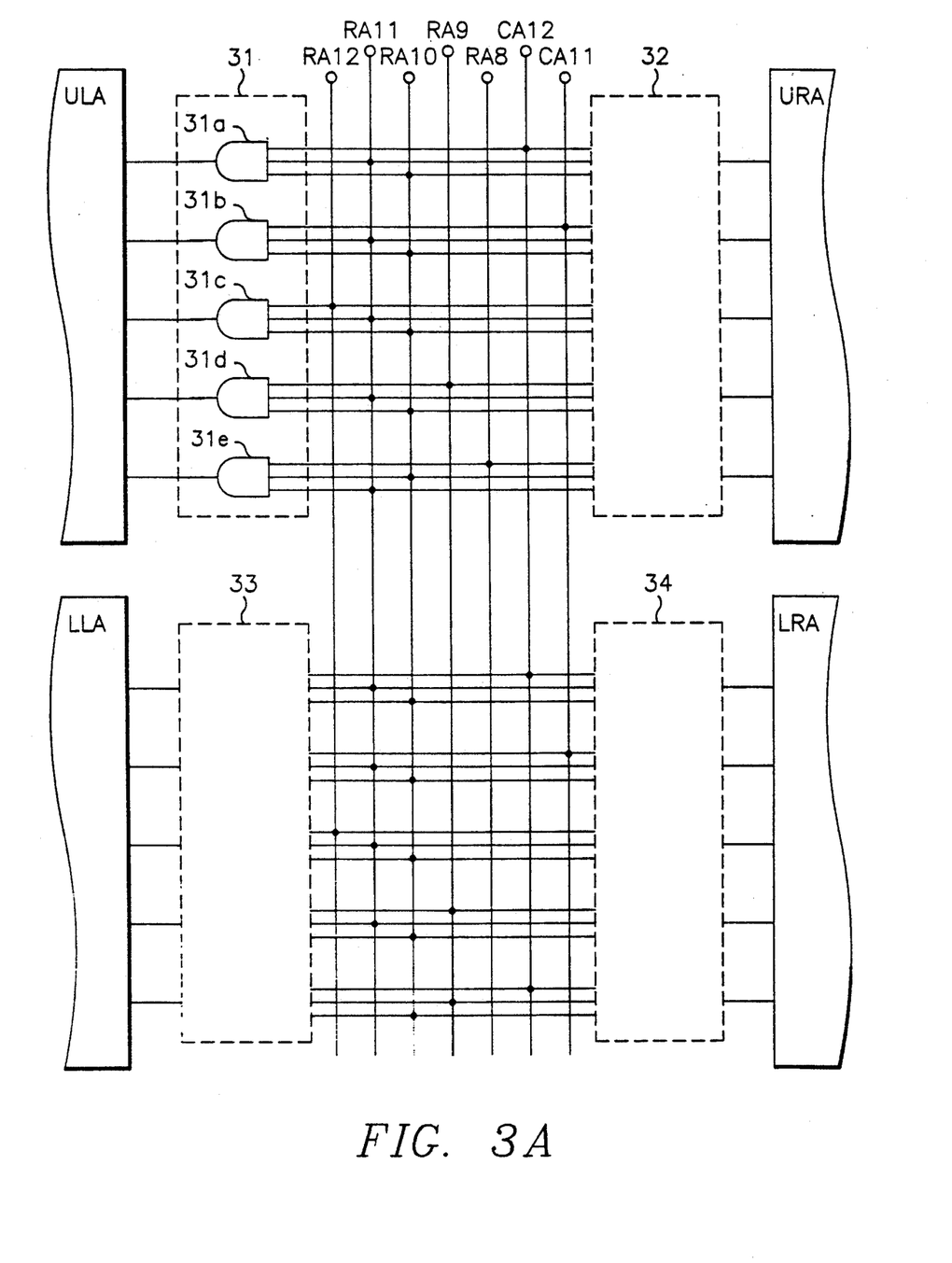
FIG. 3A shows an embodiment of selecting a main block according to the present invention.

Referring to FIG. 2, FIG. 2 shows how an upper left main block ULA is selected and subblocks SB1, SB5, SB9, SB13, SB17, SB21, SB25, SB29 thereof are activated. In FIG. 3A, an embodiment of a selection of a single main block from the four main blocks ULA, URA, LLA and LRA is illustrated. Namely, block selectors 31, 32, 33, 34 select corresponding main blocks in dependence upon row and column address signals RA8-RA12 and CA11-CA12. It should be noted that the row and column address signals RA8-RA12 and CA11-CA12 have (although not depicted in the drawing) complementary row and column address signals, respectively. Logic combinations of the row address signals applied to the respective block selectors 31 to 34 are described in detail in FIGS. 3B to 3E by way of an example. In the embodiment, the four different logic combinations are obtained using the row address signals RA10,RA10, RA11, RA11.

Figure 3B:
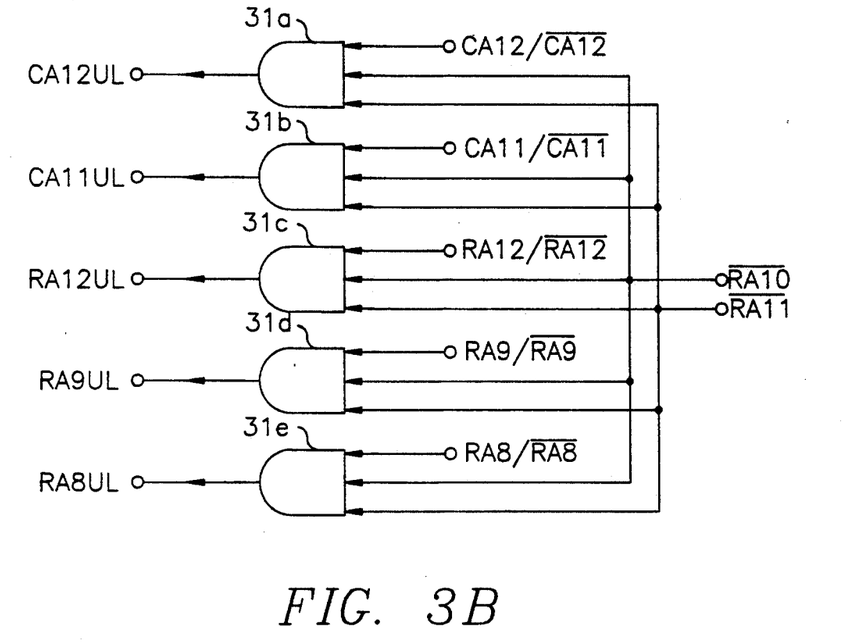
FIG. 3B through 3E show detailed views of the respective block selectors.
Figure 3C:
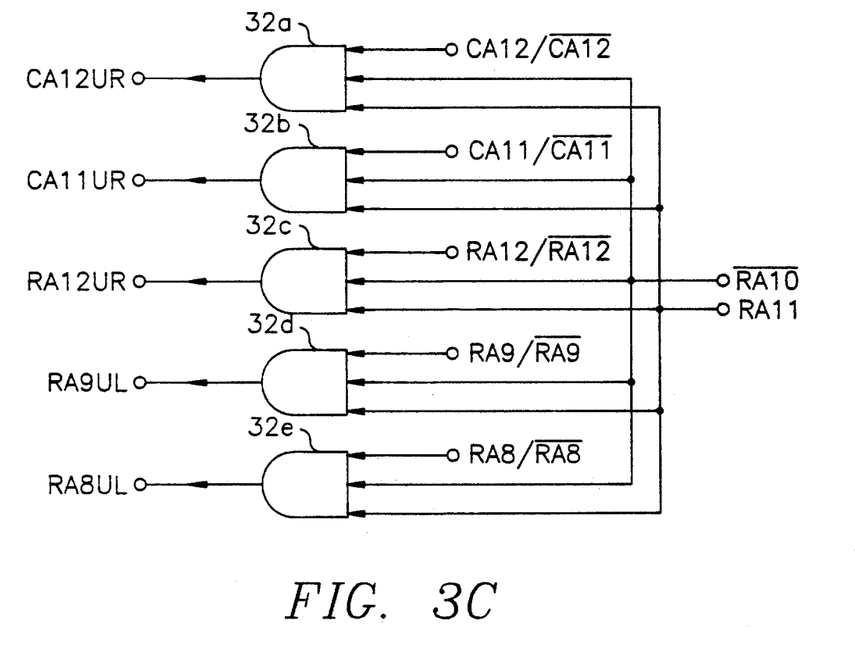
Figure 3D:
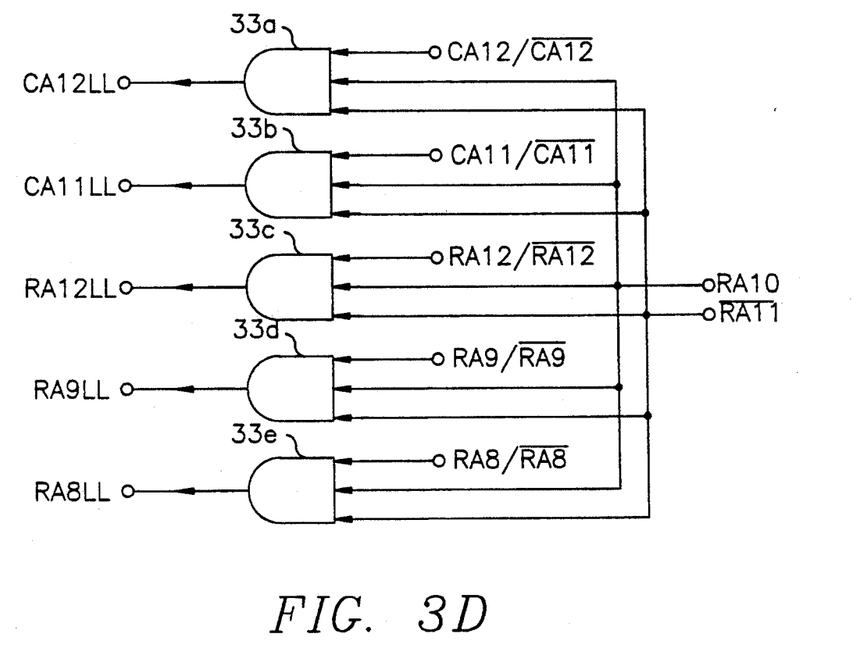
Figure 3E:
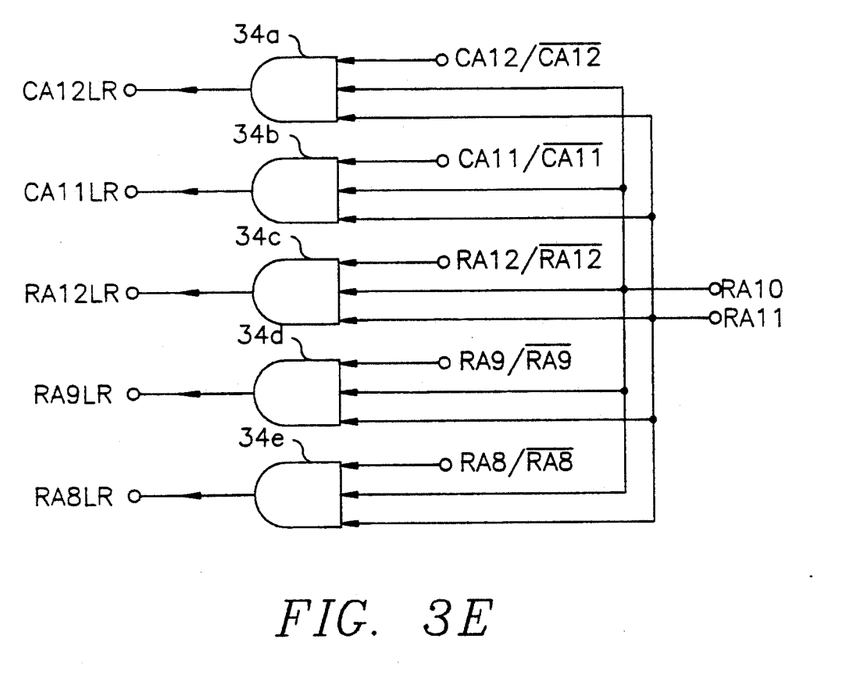

Referring to FIG. 3B, it is noted that when the row address signals RA10,RA11 are at the logic high, the AND gates 31a-31e are all enabled and thus the upper left main block ULA can select the 32 subblocks (i.e., $2^5$) according to the row and column address signals RA8/RA8, RA9/RA9, RA12/RA12, CA11/CA11, CA12/CA12. Namely the output signals CA12UL, CA11UL, RA12UL, RA9UL and RA8UL of the AND gates 31a-31e can generate 32 subblock selection signals (i.e., $2^5$) for selecting the 32 subblocks. Similarly, in FIG. 3C, the upper right main block URA is selected by the row address signals RA10,RA11. When the row address signals RA10,RA11 are enabled, the 32 subblocks in the upper right main block URA are selected according to the address signals CA12/CA12, CA11/CA11, RA12/RA12, RA9/RA9, RA8/RA8 which are applied to the input of the AND gates 32a-33e. In FIG. 3D, the lower left block LLA is selected by the row address signals RA10,RA11 and the lower right block LRA in FIG. 3E is selected by the row address signals RA10, RA11. Such a decoding process can be appreciated from the following Table 1.

TABLE 1

| ROW ADDRESS SIGNAL | | | | MAIN BLOCK | | | |
|---|---|---|---|---|---|---|---|
| RA10 | RA10 | RA11 | RA11 | ULA | URA | LLA | LRA |
| 0 | 1 | 0 | 1 | SEL | X | X | X |
| 0 | 1 | 1 | 0 | X | SEL | X | X |
| 1 | 0 | 0 | 1 | X | X | SEL | X |
| 1 | 0 | 1 | 0 | X | X | X | SEL |

(where the term "SEL" stands for "selected" and "X" for "unselected")

Of course, it should be noted that the row address signals are not limited to the signals RA10 and RA11 and other address signals can be used for decoding the subblock selection signals.

Figure 4A:
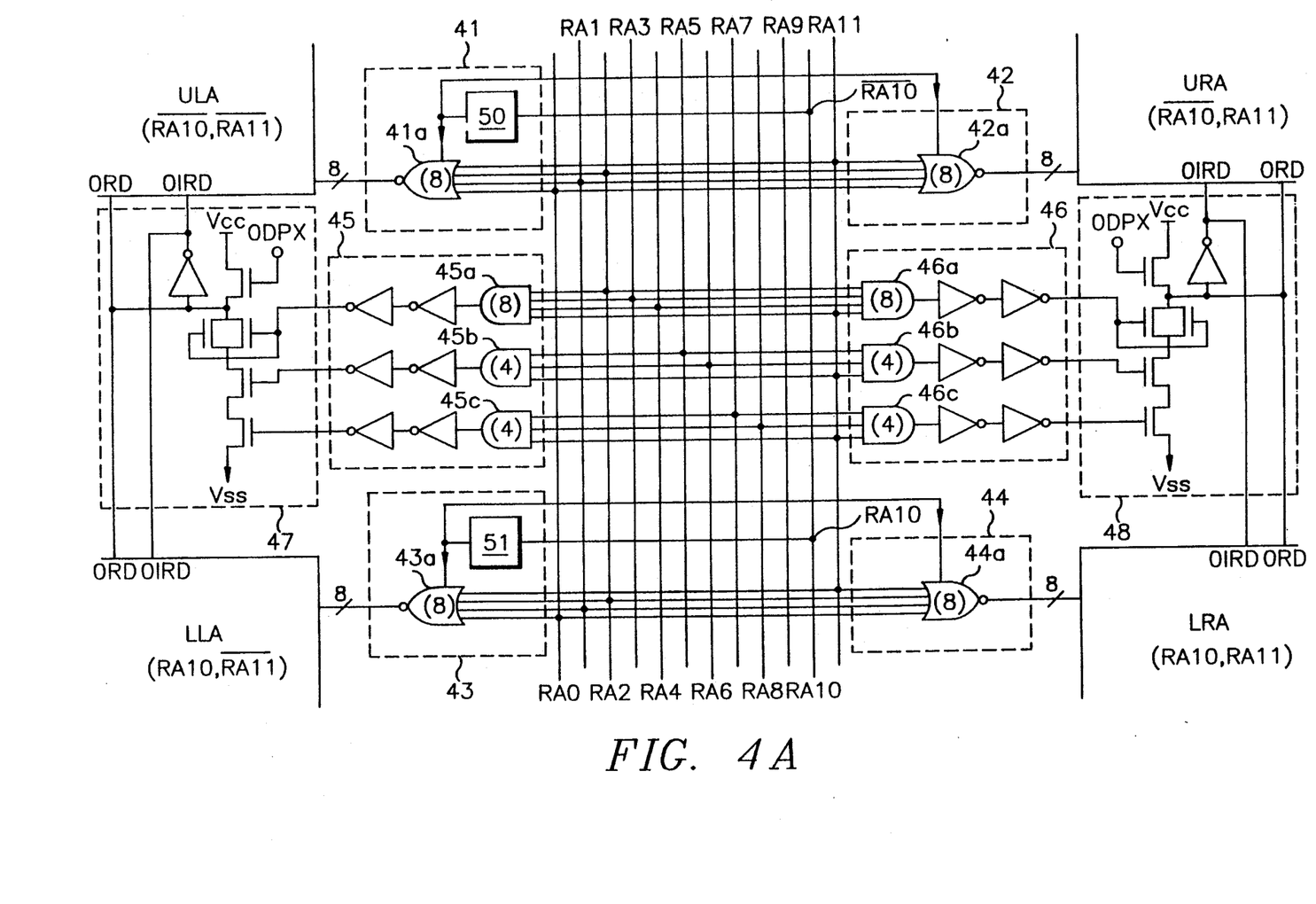
FIG. 4A and 4B show an embodiment of a row address decoder and a boost clock generator according to the present invention.

Referring to FIG. 4A, described are embodiments of a row decoder and a subblock selection circuit which are designed to meet the subblock and main block activation according to the present invention. The main blocks ULA, URA, LLA, LRA include subblock selection circuits 41, 42, 43 and 44, respectively. The word lines of the left main blocks ULA and LLA, and the right main blocks URA and LRA share common row address decoders 47 and 48, respectively. The row address decoders 47 and 48 receive the output signals of row address predecoders 45 and 46, respectively. It should be noted that the address signals RA0-RA11 have the complementary signals RA0-RA11. The subblock selection circuits 41 and 43 include control clock generators 50 and 51 and implement the logic NORing of the row address signals input to apply the output signals thereof to a corresponding main block. The NOR gates 41a, 42a, 43a and 44a included in the subblock selection circuits 41, 42, 43 and 44, and the AND gates 45a, 45b, 45c, 46a, 46b and 46c included in the row address predecoders 45 and 46 are for decoding the row address signals input in a predetermined logic combination. However, in practice the NOR gates 41a, 42a, 43a and 44a each are comprised of eight NOR gates, respectively and thus eight output signals are generated from the eight NOR gates as word line driving signals. Then, since $2^8 = 256$, each subblock selection circuit can control or select a subblock having two hundred and fifty-six word lines. Namely, the respective subblock selection circuits control the corresponding subblocks. For reference, in case of the memory cell arrays of FIGS. 1 and 2, a single subblock has 512 Kbits of memory capacity (1 Kbits=1024 bits) because the subblock includes 512 word lines (including dummy word lines) and 1096 bit lines (including 72 redundant bit lines). Accordingly, a single main block has 512 K $\times 32 = 2 \times 2 \times 2 \times 2 = 16$ Mbits, and the memory device has in total 16 Mbits$\times 4 = 64$ Mbits of memory capacity. Further, since ten row address signals are applied to the row address predecoders 45 and 46, each row address predecoder makes $2^{10} = 1024$ combination numbers.

As a result, the left row address predecoder 45 selects 1024 word lines from the respective subblocks within the left main blocks ULA and LLA, and the right row address predecoder 46 also selects 1024 word lines from the respective subblocks within the right main blocks URA and LRA. In FIG. 4A, it is shown that the row address decoders 47 and 48 only are arranged at the left and right main blocks, respectively. However, in practice 1024 row address decoders having the same structure as the row address decoders 47 and 48 are required. Further the AND gates 45a/46a, 45b/46b and 45c/46c in the row address predecoders 45 and 46 require practically 8, 4 and 4 AND gates, respectively, The control clock generator 51 receives the row address signal RA10 to provide a control signal to the lower left and right main blocks LLA and LRA, so as to control operation of the NOR gates 43a and 44a. The NOR gate 43a is for selecting the subblocks in the lower left main block LLA and the NOR gate 44a is for selecting the subblocks in the lower right main block LRA. Further, the eight NOR gates 43a receive the row address signals RA0, RA1, RA2 and RA11. Similarly, the eight NOR gates 44a receive the row address signals RA0, RA1, RA2 and RA11. In the meantime, the AND gates 45a, 45b, 45c of the left row address predecoder 45 for controlling the row address decoder 47 corresponding to the left main blocks ULA and LLA, receive subblock decoding row address signals (RA2, RA3, RA4,) (RA5, RA6) and (RA7, RA8), respectively, as well as the row address signal RA11.

Figure 4B:
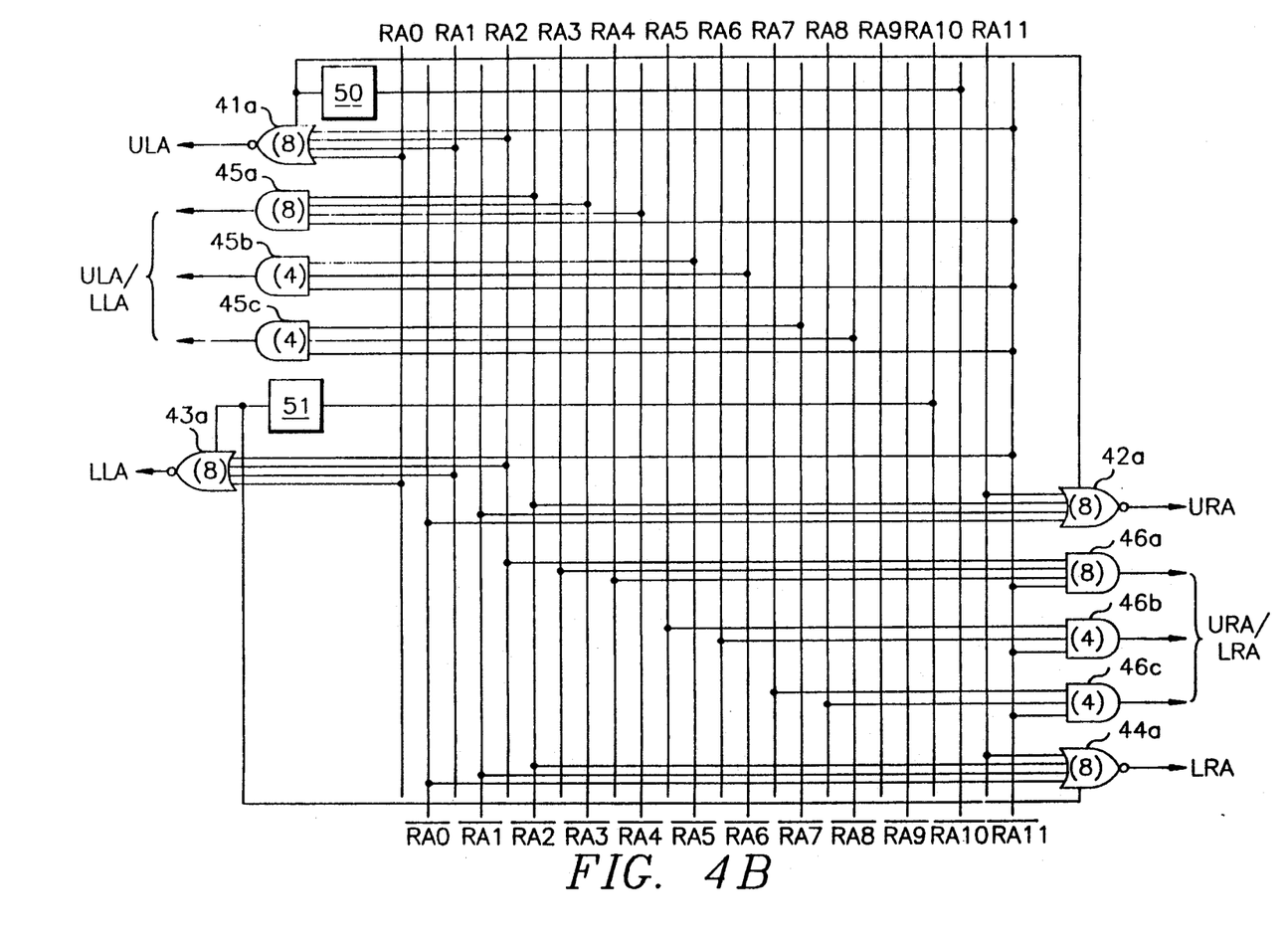

Referring to FIG. 4B, there are described in detail the states of the row address signals being applied to the subblock selection circuits, 41, 42, 43 and 44, and the row address predecoders 45 and 46. The control clock generator 50 for controlling the NOR gates 41a and 42a, receive the row address signal RA10 which is commonly related to select the main blocks ULA and URA. The NOR gate 41a is for selecting the subblocks within the upper left main block ULA; and the NOR gate 42a is for selecting the subblocks within the upper right main block URA. The NOR gate 41a receives the row address signals RA0, RA1, and RA2 and RA11, in order to select the subblocks of the upper left main block ULA. Similarly, the NOR gate 41a is practically comprised of eight NOR gates to which the row address signals RA11 is commonly applied to the eight NOR gates and other three row address signals RA0, RA1, and RA2 are applied to the eight NOR gates with a predetermined logic combination. Such connections are made for the other NOR gates 42a, 43a, and 44a. Namely, the NOR gate 42a is practically comprised of eight NOR gates and the eight NOR gates receive commonly the address signal RA11, and three subblock decoding signals, RA0, RA1, RA2 are applied to the eight NOR gates with a predetermined logic combination to generate eight logic combination signals outputs. The AND gates, 46a, 46b, and 46c of the right row address predecoder 46 for controlling the row address decoder 48 corresponding to the right main blocks URA and LRA are comprised of eight, four and four AND gates, respectively, and are copied to receive the common row address signal and the subblock decoding row address signals (RA2, RA3, RA4), (RA5, RA6) and (RA7, RA8) which are respectively applied to the AND gates with a predetermined logic combination.

As can be appreciated from the foregoing descriptions, a semiconductor memory device having a plurality of subblocks according to the present invention activates the subblocks only within a single main block so as to reduce the power consumptions.

The foregoing description shows only a preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. A semiconductor memory device having first, second, third and fourth main blocks, each main block having a plurality of subblocks of respective memory cells, said semiconductor memory device comprising:
   block selection means for selecting one of said first, second, third and fourth main blocks upon receipt of first and second row address signals;
   first means for selecting the subblocks of said first main block upon receipt of first and second complementary row address signals;
   second means for selecting the subblocks of said second main block upon receipt of said first complementary row address signal and said second row address signal;
   third means for selecting the subblocks of said third main block upon receipt of said first row address signal and said second complementary row address signal;
   fourth means for selecting the subblocks of said fourth main block upon receipt of said first and second row address signals;
   first row address predecoder means for selecting word lines of the subblocks of said first and third main blocks upon receipt of said second complementary row address signal; and
   second row address predecoder means for selecting word lines of the subblocks of said second and fourth main blocks upon receipt of said second row address signal.

2. A semiconductor memory device having a plurality of main blocks, each main block including a plurality of subblocks, said semiconductor memory device comprising:
   block selection means for selecting one of said main blocks in response to row address signals;
   first means for selecting the subblocks of the selected main block in response to the row address signals; and
   second means for maintaining the nonselected main blocks non-enabled in response to the row address signals.

3. The semiconductor memory device as claimed in claim 2, wherein said second means is enabled in response to complementary row address signals having different logic states from said row address signals.

4. The semiconductor memory device as claimed in claim 2, further comprising:
   first decoding means for selecting word lines of the subblocks of the selected main block in response to said row address signals; and
   second decoding means for maintaining nonselected word lines of the subblocks of the selected main block non-enabled in response to the said row address signals.

5. A semiconductor memory device, comprising:
   a plurality of main blocks, each main block comprising a plurality of subblocks of memory cells;
   a plurality of word lines arranged to connect with said plurality of subblocks of memory cells;
   a first subblock selection means for enabling selection of designated subblocks of a first main block in dependence upon first and second row address signals;
   second subblock selection means for enabling selection of designated subblocks of a second main block in dependence upon said second row address signal and a third row address signal, said third row address signal being complementary to said first row address signal;

third subblock selection means for enabling selection of designated subblocks of a third main block in dependence upon said first row address signal and a fourth row address signal, said fourth row address signal being complementary to said second row address signal;

fourth subblock selection means for enabling selection of designated subblocks of a fourth main block in dependence upon fifth and sixth row address signals, said fifth and sixth row address signals being complementary to said first and second row address signals, respectively;

first row address predecoder means for selecting word lines of the designated subblocks of said first and third main blocks in dependence upon said fourth row address signal; and second row address predecoder means for selecting word lines of the designated subblocks of said second and fourth main blocks in dependence upon said second row address 6. A semiconductor memory device having a plurality of main blocks, each main block including a plurality of subblocks of memory cells, and a plurality of word lines arranged to connect with said plurality of subblocks of memory cells, said semiconductor memory device comprising:

means for receiving first, second, third, fourth, fifth, sixth, seventh, eighth, ninth, tenth, eleventh and twelfth row address and complementary row address signals;

first subblock selection means coupled to receive said first, second and third row address signals, for selecting designated subblocks of memory cells within a first main block in dependence upon reception of said twelfth complementary row address signal;

second subblock selection means coupled to receive said first, second and third complementary row address signals, for selecting designated subblocks of memory cells within a second main block in dependence upon reception of said twelfth row address signal;

third subblock selection means coupled to receive said first, second and third row address signals, for selecting designated subblocks of memory cells within a third main block in dependence upon reception of said twelfth complementary row address signal;

fourth subblock selection means for responding to said first, second and third complementary row address signals, for selecting designated subblocks of memory cells within a fourth main block in dependence upon reception of said twelfth row address signal;

first row address predecoder means for responding to said third, fourth, fifth, sixth, seventh, eighth, ninth and twelfth complementary row address signals, to select word lines of the designated subblocks of said first and third main blocks; and second row address predecoder means for responding to said third, fourth, fifth, sixth, seventh, eighth and ninth row address signals and said twelfth complementary row address signal, to select word lines of the designated subblocks of said second and fourth main blocks.

7. The semiconductor memory device as claimed in claim 6, wherein said first subblock selector means comprises a first plurality of NOR gates coupled to respond to said first, second, and third row address signals to generate a first plurality of word line driving signals for accessing corresponding word lines of said designated subblocks of said first main block, and said second subblock selector means comprises a second plurality of NOR gates coupled to respond to said first, second and third complementary row address signals to generate a second plurality of word line driving signals for accessing corresponding word lines of said designated subblocks of said second main block.

8. The semiconductor memory device as claimed in claim 7, further comprises of first clock generator means for controlling operations of said first and second plurality of NOR gates in response to said eleventh complementary row address signal.

9. The semiconductor memory device as claimed in claim 8, wherein said third subblock selector means comprises a third plurality of NOR gates coupled to respond to said first, second and third row address signals to generate a third plurality of word line driving signals for accessing corresponding word lines of said designated subblocks of said third main block, and said fourth subblock selector means comprises a fourth plurality of NOR gates coupled to respond to said first, second and third complementary row address signals to generate a fourth plurality of word line driving signals for accessing corresponding word lines of said designated subblocks of said fourth main block.

10. The semiconductor memory device as claimed in claim 9, further comprised of second clock generator means for controlling operations of said third and fourth plurality of NOR gates in response to said eleventh row address signal.

* * * * *

UNITED STATES PATENT AND TRADEMARK OFFICE
CERTIFICATE OF CORRECTION

PATENT NO. : 5,327,389  
DATED : 5 July 1994  
INVENTOR(S) : Yong-Sik Seok, Dong-Sun Min, Dong-Soo Jun and Jae-Gu Roh Page 1 of 3

It is certified that error appears in the above-indentified patent and that said Letters Patent is hereby corrected as shown below:

Column 3,    line 9, change "invent" to --invention--.

line 53, change "RA 10, RA 11 to --$\overline{RA10}$, $\overline{RA11}$--.

line 57, change "RA8/RA8" to --RA8/$\overline{RA8}$--;

change "RA9/RA9 to --RA9/$\overline{RA9}$--, change "RA12/RA12" to --RA12/$\overline{RA12}$ --and change "CA11/CA11 to--CA11/$\overline{CA11}$--.

line 58, change "CA12/CA12" to --CA12/$\overline{CA12}$--.

line 63, change "RA10" to --$\overline{RA10}$--.

line 64, change "RA10" to --$\overline{RA10}$--.

line 66, change "CA12/CA12" to --CA12/$\overline{CA12}$--.

line 67, change "/CA11 to--/$\overline{CA11}$;

change "RA12/RA12" to --RA12/$\overline{RA12}$--;

change "RA9/RA9 to --RA9/$\overline{RA9}$--, and change "RA8/RA8" to --RA8/$\overline{RA8}$--.

UNITED STATES PATENT AND TRADEMARK OFFICE
CERTIFICATE OF CORRECTION

PATENT NO. : 5,327,389
DATED : 5 July 1994
INVENTOR(S) : Yong-Sik Seok, Dong-Sun Min, Dong-Soo Jun and Jae-Gu Roh It is certified that error appears in the above-indentified patent and that said Letters Patent is hereby corrected as shown below:

Column 4,  line 2, change "RA 11" to $\overline{RA11}$ --.

line 9, change "RA 10" (second occurrence) to --$\overline{RA10}$-- and change "RA 11" (second occurrence) to --$\overline{RA11}$ --.

line 33, change " RA0-RA 11 to --$\overline{RA10}$, $\overline{RA11}$ --.

Column 5,  line 15, change "RA 11" to --$\overline{RA11}$ --.

line 16, change RA0, RA1" to --$\overline{RA0}$, $\overline{RA1}$--.

line 17, change "RA2" to --$\overline{RA2}$-- line 23, change "RA 11" to --$\overline{RA11}$ --.

line 29, change "receive" to --receives-- and change "RA 10" to --$\overline{RA10}$.

line 35, change "RA 11" to --$\overline{RA11}$ --.

UNITED STATES PATENT AND TRADEMARK OFFICE
CERTIFICATE OF CORRECTION

PATENT NO. : 5,327,389
DATED : 5 July 1994
INVENTOR(S) : Yong-Sik Seok, Dong-Sun Min, Dong-Soo Jun and Jae-Gu Roh It is certified that error appears in the above-indentified patent and that said Letters Patent is hereby corrected as shown below:

Column 5, line 39, change "RA 11" to -- $\overline{RA11}$ --.

line 47, change RA0, RA1, RA2" to -- $\overline{RA0}, \overline{RA1}, \overline{RA2}$ --.

line 55, after "signal", insert -- $\overline{RA11}$ --.

Column 6, line 63, delete "a".

Column 8, line 32, change "comprises" to --comprised--.

Signed and Sealed this

Thirty-first Day of October 1995

Attest:

BRUCE LEHMAN

*Attesting Officer*     *Commissioner of Patents and Trademarks*